(12) United States Patent
Blosse et al.

(10) Patent No.: US 6,399,512 B1
(45) Date of Patent: Jun. 4, 2002

(54) METHOD OF MAKING METALLIZATION AND CONTACT STRUCTURES IN AN INTEGRATED CIRCUIT COMPRISING AN ETCH STOP LAYER

(75) Inventors: Alain Blosse, Belmont; Sanjay Thedki, Santa Clara; Jianmin Qiao, Fremont; Yitzhak Gilboa, Sunnyvale, all of CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/593,968

(22) Filed: Jun. 15, 2000

(51) Int. Cl.[7] .............................................. H01L 21/00
(52) U.S. Cl. ...................... 438/723; 216/38; 216/39; 216/79; 438/738; 438/740; 438/743
(58) Field of Search ................. 438/691, 692, 438/723, 724, 737, 738, 740, 743, 744, 637, 672; 216/18, 38, 39, 67, 79

(56) References Cited

U.S. PATENT DOCUMENTS

| 4,789,648 A | 12/1988 | Chow et al. |
| 4,933,743 A | 6/1990 | Thomas et al. |
| 4,954,142 A | 9/1990 | Car et al. |
| 5,093,279 A | 3/1992 | Andreshak et al. |
| 5,262,354 A | 11/1993 | Cote et al. |
| 5,312,777 A | 5/1994 | Cronin et al. |
| 5,371,047 A | 12/1994 | Greco et al. |
| 5,397,741 A | 3/1995 | O'Connor et al. |
| 5,453,639 A | 9/1995 | Cronin et al. |
| 5,496,771 A | 3/1996 | Cronin et al. |
| 5,578,524 A | * 11/1996 | Fukas et al. |
| 5,592,024 A | * 1/1997 | Aoyama et al. |
| 6,080,661 A | * 6/2000 | Bothra |
| 6,121,098 A | * 9/2000 | Strobl |

FOREIGN PATENT DOCUMENTS

| JP | 932 980 | * 12/1997 |
| JP | 2000-91440 | * 3/2000 |

OTHER PUBLICATIONS

Cypress Semiconductor CAHNERS Internet Release, Jun. 5, 2000, Dual–Damascene: Overcoming Process Issues, 16pp.

* cited by examiner

Primary Examiner—William A. Powell
(74) Attorney, Agent, or Firm—Oblon, Spivak, McClelland, Maier & Neustadt, P.C.

(57) ABSTRACT

The invention concerns a method for simultaneously forming a metallization and contact structure in an integrated circuit. The method involves the steps of etching a trench dielectric layer of a composite structure having a semiconductor substrate with an active region, a gate structure thereon, at least one dielectric spacer adjacent to the gate structure, a contact dielectric layer over the semiconductor substrate, the gate structure and the dielectric spacer, an etch stop layer over the contact dielectric layer, and a trench dielectric layer over the etch stop layer, to form a trench in the trench dielectric under etch conditions which do not substantially etch the etch stop layer; thereafter, forming an opening in the etch stop layer and the contact dielectric layer by etching under conditions which do not damage the gate structure to expose the active region; and depositing a conductive material into the opening and the trench.

20 Claims, 3 Drawing Sheets

METHOD OF MAKING METALLIZATION AND CONTACT STRUCTURES IN AN INTEGRATED CIRCUIT COMPRISING AN ETCH STOP LAYER

BACKGROUND OF THE INVENTION

1. Field of the Invention

The present invention relates to a method of forming metallization and contact structures in an integrated circuit, using a "dual damascene"-like procedure.

2. Discussion of the Background

During the preparation of integrated circuits, electrical connections between active regions of a semiconductor device are necessary.

One method of preparation involves the use of self-aligned contact (SAC) technology, which may comprise forming an opening through a dielectric material to an active region of a semiconductor device, wherein a gate structure adjacent to the active region may be protected during the contact opening etching step by encapsulation with a material which may have a lower etching rate than that of the surrounding dielectric material. In this fashion, one may reduce the total area consumed by functional circuitry while minimizing damage to the gate structure that might otherwise result from small errors in aligning the contact hole with the underlying conductive region.

After such an opening has been formed, it may be filled with a conductive material and planarized to form a self-aligned contact. Two or more SACs may be electrically connected by a local trench which may be formed by patterning a metal layer, such that the metal layer electrically connects the SACs, followed by depositing and optionally planarizing a dielectric material.

A "damascene" metallization layer is an alternative to the pattered metal layer described above. A "damascene" metal layer is one where a trench or trough is formed in a dielectric material layer, then the trench is filled with a conductive metal. Damascene processes are becoming more widely used in semiconductor processing.

Problems observed in the interface between the SAC and the interconnect formed by damascene metallization have produced "dual damascene" processes, in which a channel is formed in a trench dielectric and an opening is formed in an underlying contact dielectric, both of which are then filled with a metal. This technology offers the advantages of simultaneously forming the contact and interconnect, which can result in reduced processing steps and a more highly conductive interface between the contact and interconnect structures.

Yen U.S. Pat. No. 5,861,676, reports a method of forming interconnects and contacts between elements in a semiconductor or integrated circuit.

Avanzino et al. U.S. Pat. No. 5,795,823 reports the fabrication of conductive lines and connecting vias using dual damascene with only one mask pattern. This is also reported by Avanzino et al. in U.S. Pat. No. 5,614,765.

Dai U.S. Pat. No. 5,877,076 reports a dual damascene process using opposite type two-layered photoresist.

Dai et al U.S. Pat. No. 5,876,075 reports forming dual damascene patterns using a single photoresist process.

Dai U.S. Pat. No. 5,882,996 discloses a method for patterning dual damascene interconnections using a developer soluble ARC interstitial layer.

Huang et al. U.S. Pat. No. 5,635,423 reports a modified dual damascene process in which an initial opening in a trench dielectric is enlarged while simultaneously extending a via opening through an etch stop layer and a via dielectric.

Qiao and Nulty, U.S. Ser. No. 326,432, filed on Jun. 4, 1999, report a method and structure for making self-aligned contacts.

Blosse et al. IEEE 1999 International Interconnect Technology Conference, p 215–217 reports a comparison between counterbore dual damascene and self-aligned dual damascene in forming aluminum interconnects using PVD.

In spite of known techniques for forming contacts and interconnects, increases in device density and demands for increased processing efficiency, have spurred new efforts to effectively produce semiconductor interconnections.

SUMMARY OF THE INVENTION

One embodiment of the present invention involves a method of preparing interconnects and self-aligned contact structures through a dual damascene process.

Another embodiment of the present invention involves a dual damascene method of forming metallization and self-aligned contact structures to active regions of a semiconductor device controlled by a gate structure.

Another embodiment of the present invention involves a dual damascene method of forming metallization and contact structures to an active region of a semiconductor device controlled by a gate structure, in which the gate is protected during etching of the contact hole.

Another embodiment of the present invention involves a dual damascene method of forming metallization and contact structures to an active region of a semiconductor device in which etching a contact dielectric layer is effectively prevented by an overlying etch stop layer.

Another embodiment of the present invention involves a dual damascene method of forming metallization and contact structures to an active region of a semiconductor device in which the gate may be protected during etching the contact hole and in which etching of the contact hole through the contact dielectric layer may be conducted in the absence of a patterned photoresist.

These and other embodiments of the present invention are made possible by a dual damascene method in which etching through the trench and contact dielectric layers are conducted using self-aligned contact techniques.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
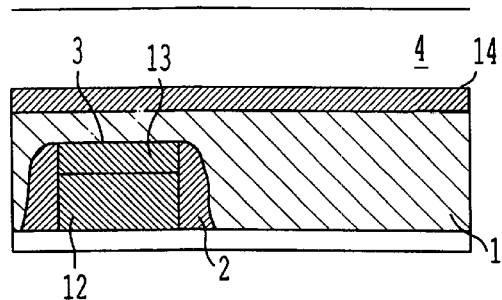
FIG. 1 illustrates a semiconductor structure comprising a contact dielectric layer, an etch stop layer and a trench dielectric layer.

Within one context of the present invention, a multi-level substrate comprising active regions and dielectric layers is etched to form both a trench and contact hole in which alignment of the contact hole mask is given processing latitudes using SAC techniques.

A multi-level substrate to be processed according to the present invention may be prepared according to conventional methods known to those of ordinary skill in the art. Suitable substrates comprising active regions, gate structures and dielectric layers may be prepared by conventional methods known to those of ordinary skill in the art.

Non-limiting examples of active regions to which an opening may be formed include a source or a drain region of a silicon, germanium or GaAs substrate (which may be lightly, heavily and/or very heavily doped with conventional N-dopants [such as nitrogen, phosphorous, arsenic, antimony, bismuth, tellurium, sulfur, mixtures thereof etc.] or P-dopants [such as B, Al, Ga, In, mixtures thereof, etc.]), silicide source and drain regions, metallization or conductive (metal) interconnect structures, field oxide regions, gate and/or word line structures (which may comprise [doped] polysilicon and/or a conventional metal silicide located in the first functional layer of a conductive material, above the substrate), etc.

Suitable gate structures, include those known to those of ordinary skill in the art, and which by way of example may comprise a MOS structure, a floating gate/control gate structure (e.g. for a non-volatile transistor), a SONOS transistor, etc.

Before depositing the contact dielectric, one may form spacers, which may prevent or inhibit etching of the gate or metallization structure while etching the contact hole, and which may protect conventional lightly doped source/drain structures during (source/drain) well implants. Suitable spacers may be formed by conventional methods known to those of ordinary skill in the art, such as depositing a dielectric spacer material by LPCVD or PECVD, followed by anisotropically etching the dielectric spacer material to form the spacer. A suitable dielectric spacer material may be selected by those of ordinary skill in the art and may provide a lower rate of etching relative to the surrounding contact dielectric material. For example, one suitable spacer material comprises a nitride such as silicon nitride (e.g. when the contact dielectric comprises an oxide) or a silicon oxide (e.g. when the contact dielectric comprises a nitride or a second compositionally distinct oxide). Typically the spacer layer will have a width, measured at the base, of from about 100 to about 1,500 Å, generally about 500 Å to 800 Å.

Within the context of the present invention it may also be desirable for the etching rate of the contact dielectric material to differ from that of the gate structure, under the etching conditions used to etch the contact opening, sufficiently to avoid substantial etching of the gate structure. However, it is within the scope of the present invention to form a protective layer, such as silicon nitride, over the gate structure, to increase the difference in etching rates between the contact dielectric layer and the gate structure. The formation and selection of a suitable material is within the level of skill of those of ordinary skill in the art, based on conventional SAC techniques.

Suitable contact dielectric materials are deposited over the gate structure (and optionally planarized) by conventional methods known to those of ordinary skill in the art. Suitable contact dielectric materials may be selected by those of ordinary skill in the art such that the etching rate of the contact dielectric is sufficiently greater than that of the dielectric spacer material surrounding the gate structure under the conditions used to etch the contact dielectric to permit relatively complete etching of the contact dielectric material without substantial etching of the dielectric spacer material (and/or while reliably protecting the gate 12 from the contact hole etch process). For example, the contact dielectric layer may comprise one or more layers of dielectric materials such as silicon dioxide or a doped silicate glass such as fluorosilicate glass (FSG), borosilicate glass (BSG), phosphosilicate glass (PSG) and/or borophosphosilicate glass (BPSG). The contact dielectric material may be subject to a reflow step for densification and/or planarization after deposition. In addition, the contact dielectric material may be further planarized, for example by isotropic etching, annealing or chemical mechanical polishing (CMP), by processes known to those skilled in the art.

Further examples of contact dielectric materials include conventional oxides, nitrides, oxynitrides, and other dielectrics, such as spin-on glass (SOG), P-doped silicon oxide (P-glass), silicon nitride ($Si_xN_y$), silicon oxynitride (e.g., of the general formula $Si_aO_xN_y$ such that $(x/2)+(3y/4)=a$), $Al_2O_3$, metal nitrides such as aluminum nitride (e.g. AlN), $V_2O_5$, tetraethylorthosilicate-based oxides, titanium oxide, aluminum oxynitrides (e.g. of the general formula $Al_bO_xN_y$ such that $(2x/3)+y=b$), aluminosilicates and nitrides thereof (e.g. of the general formula $[Si_aAl_bO_xN_y]$ where $x=2a+3b/2$ and $y=4a/3+b$), and boron- and/or phosphorous-doped aluminates and aluminosilicates. Preferably, the contact dielectric material comprises a layer of PSG containing an atomic % of P (relative to the sum of P atoms and Si atoms) of 1–15%, preferably 3–12%, more preferably 5–11%.

The final thickness of the contact dielectric layer is not particularly limited, but preferably is within the range of about 0.3 to 3.0 $\mu$m, more preferably 0.4 to 2.0 $\mu$m, even more preferably 0.5 to 1.0 $\mu$m. A typical value for a 0.18 $\mu$m gate width technology may be 0.6 $\mu$m. The contact dielectric layer may comprise a single dielectric material or multiple layers of the same or different dielectric materials.

Overlying the contact dielectric layer is an etch stop layer such as silicon nitride, silicon oxynitride, silicon oxyboronitride or a bilayer of silicon nitride overlying TEOS, which has a substantially lower rate of etching than the overlying trench dielectric material under the conditions for etching the trench dielectric material. In this context, the difference in the etch rate between the trench dielectric material and the etch stop dielectric material is $\geq 8:1$, more preferably $\geq 12:1$, even more preferably $\geq 15:1$. Suitable etch stop layers may be formed by conventional methods known to those of ordinary skill in the art. The etch stop layer typically will have a thickness of from about 100 to about 1,000 Å, preferably from about 100 to about 800 Å, more preferably from about 100 to about 500 Å. When the etch stop layer is a bilayer of silicon nitride overlying TEOS, each layer of the bilayer may independently have a thickness of from about 400 to about 800 Å, preferably from about 500 to about 700 Å.

Overlying the etch stop layer is a trench dielectric layer of the same (or optionally greater) thickness as the interconnect structure to be formed therein. Since an etch stop layer is disposed between the trench dielectric layer and the contact dielectric layer, it is not necessary to choose a selective etch for the trench dielectric material relative to that of the underlying contact dielectric material. However, the conditions for etching the trench dielectric layer must be selective for the trench dielectric material relative to the etch stop material.

Examples of trench dielectric materials include conventional oxides, nitrides, oxynitrides, and other dielectrics, such as borophosphosilicate glass (BPSG), borosilicate glass (BSG), fluorosilicate glass, phosphosilicate glass, undoped silicate glass, spin-on glass (SOG), P-doped silicon oxide (P-glass), silicon nitride ($Si_xN_y$), silicon dioxide, silicon oxynitride (e.g. of the general formula $[Si_aO_xN_y]$ such that $(x/2)+(3y/4)=a$), $Al_2O_3$, metal nitrides such as aluminum nitride [e.g. AlN], $Si_3N_4$, $V_2O_5$, tetraethylorthosilicate-based oxides and titanium oxide, aluminum oxynitrides (e.g. of the general formula $[Al_bO_xN_y]$ such that $(2x/3)+y=b$), aluminosilicates and nitrides thereof (e.g. of the general formula $[Si_aAl_bO_xN_y]$ where $x=2a+3b/2$ and $y=4a/3+b$), boron- and/or phosphorous-doped aluminates and aluminosilicates. Preferably, the trench dielectric material is formed by plasma assisted vapor pyrolysis of TEOS (also known as tetraethylorthosilicate or tetraethoxysilane), which vapor may further include trimethylborate (TMB) as a boron source and/or phosphine as a phosphorus source, at a pressure of from about 0.3 to about 1 torr and at a temperature of approximately 640–660° C.

The thickness of trench dielectric layer is not particularly limited, but preferably is within the range of about 0.06 to 3.0 μm, more preferably 0.10 to 1.5 μm, even more preferably 0.15 to 1.0 μm. For a process having a 0.18 μm gate width, the trench thickness may be about 0.20 μm. The trench dielectric layer may comprise a single dielectric material, however, it may also comprise multiple layers of the same or different dielectric materials.

A portion of a cross section of a semiconductor structure is illustrated in FIG. 1, and includes a contact dielectric layer 1, an etch stop layer 14, a gate structure 3 including a gate 12 and a cap dielectric layer 13, and a trench dielectric layer 4.

A trench may be formed in the trench dielectric layer of the semiconductor structure by conventional photolithographic and etching techniques. However, to obtain greater resolution during photolithographic processing, an anti-reflective coating (ARC) layer (not shown) may be deposited on the exposed surface of the trench dielectric material prior to depositing a photoresist layer 5 for forming a trench mask (see FIG. 2). One suitable ARC may comprise a bottom anti-reflective coating (BARC), which may be an organic material such as those commercially available from Brewer Science (Rolla, Mo.), Clariant, Hitachi, or Tokyo Ohka (see for example, Singer, *Semiconductor International* March 1999, vol. 22 (3), pp. 55–59, the relevant portions of which are hereby incorporated by reference). Alternatively, an inorganic dielectric layer such as a dielectric ARC layer (e.g., $SiO_xN_y$, or DARC™, available from Applied Materials, Santa Clara, Calif.), a sacrificial ARC layer (e.g TiN) or a multilayered structure comprising the previously mentioned ARC layer materials, may be employed. The dielectric ARC layer may be of a thickness of from about 200 Å to about 1,000 Å, typically 300 Å to 700 Å.

A photoresist layer for patterning the trench dielectric may be formed on the trench dielectric or ARC layer by conventional methods known to those of ordinary skill in the art, such as by spin coating. The resist material may then be conventionally patterned.

Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation and deposition of negative resist materials is within the level of ordinary skill in the art and can be performed without undue experimentation. Specific non-limiting examples of negative resist systems include cresol epoxy novolac-based negative resists, as well as negative resists containing one or more photoreactive polymers as described in Kirk-Othmer Encyclopedia of Chemical Technology, 3rd Edition, vol. 17, entitled "Photoreactive Polymers", pages 680–708, the relevant portions of which are hereby incorporated by references.

Positive resists have photoreactive components that are destroyed in the regions exposed to light. Typically the resist is removed in an aqueous alkaline solution, where the exposed region dissolves away. The preparation and deposition of positive resist materials is within the level of skill of one of ordinary skill in the art and can be performed without undue experimentation. Specific non-limiting examples of suitable positive resist systems include Shipley XP9402, JSR KRK-K2G and JSR KRF-L7 positive resists, as well as positive resists containing one or more photoreactive polymers as described in Kirk-Othmer Encyclopedia of Chemical Technology, 3rd Edition, vol. 17, entitled "Photoreactive Polymers", pages 680–708, the relevant portions of which are hereby incorporated by references.

Examples of resist materials are also described by Bayer et al, IBM Tech. Discl. Bull (USA) Vol. 22, No. 5 October 1979, pp. 1855; Tabei, U.S. Pat. No. 4,613,404; Taylor et al, J. Vac. Sci. Technol. B. Vol. 13, No. 6, 1995, pp. 3078–3081; Argitis et al, J. Vac. Sci. Technol. B. Vol. 13, No. 6, 1995, pp. 3030–3034; Itani et al, J. Vac. Sci. Technol. B. Vol. 13, No. 6, 1995 pp. 3026–3029; Ohfuii et al, J. Vac. Sci. Technol. B. Vol. 13, No. 6, 1995 pp. 3022–3025; Trichkov et al, J. Vac. Sci. Technol. B. Vol. 13, No. 6, 1995, pp. 2986–2993; Capodieci et al, J. Vac. Sci. Technol. B. Vol. 13, No. 6, 1995, pp. 2963–2967; Zuniga et al, J. Vac. Sci. Technol. B. Vol. 13, No. 6, 1995, pp. 2957–2962; Xiao et al, J. Vac. Sci. Technol. B. Vol. 13, No. 6, 1995, pp. 2897–2903; Tan et al J. Vac. Sci. Technol. B. Vol. 13, No. 6, 1995, pp. 2539–2544; and Mayone et al J. Vac. Sci. Technol. Vol. 12, No. 6, 1995, pp. 1382–1382. The relevant portions of the above-identified references that describe the preparation and deposition of resist materials is hereby incorporated by reference. Selection of a resist material for the particular etching conditions is within the level of ordinary skill in the art and can be performed without undue experimentation.

The photoresist layer may be patterned by conventional lithography steps known to those of ordinary skill in the art, such as by exposing the photoresist layer to radiation passed through a photolithography mask. Such selective exposure, followed by conventional developing, can produce a trench pattern corresponding to the wiring pattern of a metallization structure. Depending on the type of photoresist material (i.e., positive or negative), selected portions of the photoresist material can be removed by developing with a suitable developer/solvent, and the resulting pattern may be heated (e.g., by baking in a furnace) prior to subsequent etching.

Figure 2:
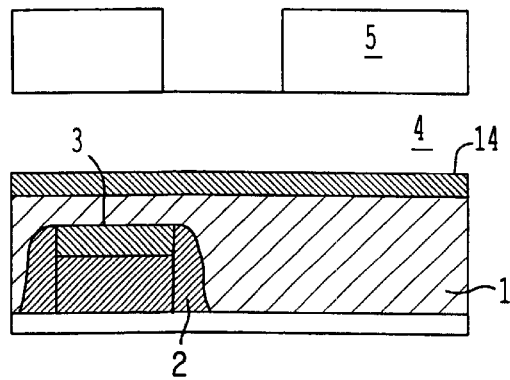
FIG. 2 illustrates a semiconductor structure comprising a patterned trench mask.

FIG. 2 illustrates a cross section of a semiconductor structure comprising a patterned trench mask 5 over trench dielectric layer 4. An optional ARC layer, disposed between the patterned trench mask 5 and trench dielectric layer 4, is not illustrated.

Etching the exposed trench dielectric material layer 4 should be conducted under conditions which substantially remove the exposed trench dielectric material 4 without substantially etching the underlying etch stop layer 14. Specific conditions may be selected by those of ordinary skill in the art. Effective etching of the trench dielectric material 4 without substantial etching of the underlying etch stop layer 14 may be accomplished by etching with an etchant comprising $CHF_3$ and/or $CF_4$, preferably a mixture of $CHF_3$ and $CF_4$ optionally in the presence of Ar, at a pressure of 100–300 mTorr, preferably about 200 m Torr, a magnetic field of 10–50 gauss, preferably about 30 gauss, at a power of 100–2,500 watt, preferably from about 500–1,500 watts. The backside of the wafer may be cooled with He at a pressure of 5–20 Torr, preferably about 14 Torr. Trench etching may be conducted for a length of time sufficient to remove some, most or all of the exposed trench dielectric material (e.g., from 0.5x to 1.25x to accommodate over etching, preferably 0.75x to 1.1x, more preferably about x, where x is the thickness of the trench dielectric layer), without substantial etching of the etch stop layer (e.g., less than or equal to 0.2y or 200 Å, preferably less than or equal to 0.15y or 150 Å, more preferably less than or equal to 0.1y or 100 Å, where y is the thickness of the etch stop layer).

In addition, suitable etching conditions are described in co-pending application U.S. Ser. No. 09/326,432 filed on Jun. 4, 1999 by Qiao and Nulty, the relevant portions of which are hereby incorporated by reference.

The etching gas may be those typically used by those of ordinary skill in the art in conventional reactive ion etching. Typically, halocarbons such as $CHF_3$, $C_4F_8$, $C_2F_6$, F-134, F-134a, $CF_4$, $SF_6$, $NF_3$ $SF_6$, $Cl_2$, HF, HCl, $CCl_4$, $C_nH_xF_y$, (where $n \geq 1$, $y \geq 1$, and $x+y=2n+2$) (see, for example, U.S. Ser. No. 08/683,407 and/or U.S. Pat. No. 5,468,342, the relevant portions of which are hereby incorporated by reference) and mixtures thereof, preferably $CHF_3$, $C_4F_8$ and/or F-134a and more preferably a mixture of $CHF_3$ and $C_4F_8$ (see U.S. 09/253,991 filed on Feb. 22, 1999). Carbon monoxide may also be incorporated into the etching gas as an optional component. Within the context of the present invention, the term "etching gas" refers to the components of the gas or gas mixture which produce active components of the plasma which etches the dielectric. Flow rates of etching gases described herein do not include oxygen or carrier gases, unless otherwise indicated.

The total flow rate of etching gas is typically 5 to 500 sccm, more preferably 15 to 300 sccm and even more preferably 25 to 250 sccm. Of this flow, anywhere from 4 to 450 sccm, preferably from 8 to 200 sccm may comprise a carrier gas such as Ne, Kr, Xe, CO, $CO_2$, $SO_2$, He, Ar, $N_2$ and mixtures thereof. Typically, the total flow rate of etching gas before striking the plasma is about the same or slightly more than the total flow rate of etching gas that may be used during an optional flash strike step or subsequent etch phase(s) or step(s) of the process. Suitable conditions are disclosed in U.S. Ser. No. 08/683,407, U.S. Ser. No. 08/577,751, U.S. Ser. No. 08/935,705, U.S. Pat. Nos. 5,468,342 and 5,562,801, the relevant portions of which are hereby incorporated by reference.

The selected conditions for etching the trench dielectric material should result in little or no substantial etching of the etch stop layer. The determination of the conditions, etchant(s) and times for such a selective etch is within the level of ordinary skill, and will typically take into consideration the thickness and composition of the trench dielectric layer and the composition of the etch stop layer. The result is a trench 6 formed in the trench dielectric layer 4, leaving the etch stop layer 14 and any ARC layer therebetween substantially intact.

Figure 3:
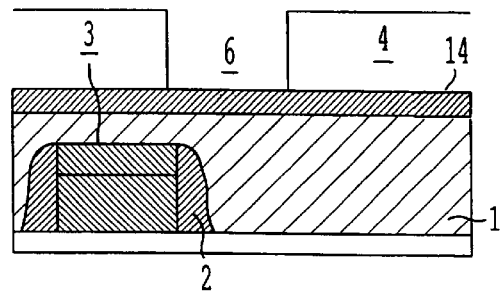
FIG. 3 illustrates a semiconductor structure comprising an etched trench dielectric layer.
Figure 4:
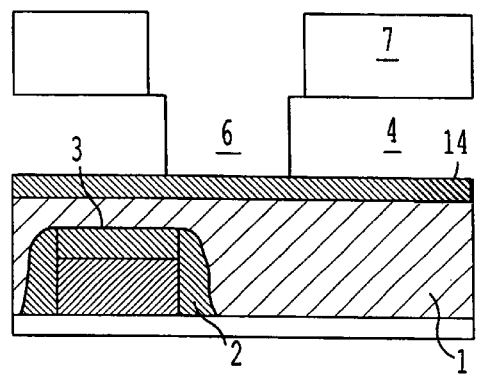
FIG. 4 illustrates a semiconductor structure comprising an etched trench dielectric layer and a patterned contact opening mask.
Figure 5:
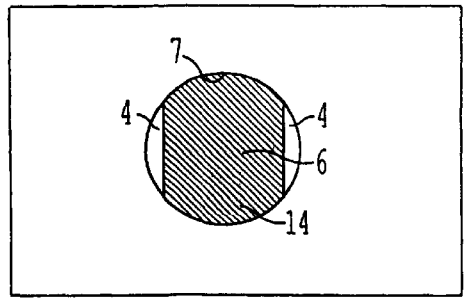
FIG. 5 illustrates a top view of the semiconductor structure illustrated in FIG. 4.

After the trench dielectric material has been etched in a pattern enabling formation of an interconnect structure 6, the trench photoresist mask 5 may be removed by conventional methods known to those of ordinary skill in the art (FIG. 3), and a contact opening mask 7 may be formed and patterned thereon (see FIGS. 4 and 5, which are a side view and a top view, respectively). Suitable photoresist materials for, and methods of forming, the contact opening mask are as described above for the trench mask. The pattern formed in the contact opening mask is typically a circular pattern, corresponding to the desired shape of the contact. Patterning of the contact opening mask 7 may be performed under suitable conditions known to those of ordinary skill in the art. A BARC layer as described above may also be used to enhance the patterning resolution of the contact hole mask.

After forming the contact opening mask 7, the exposed portions of the trench dielectric layer 4 and the BARC or inorganic anti-reflective coating layer 14 are removed, typically by etching. The trench dielectric material may be etched in the manner described above, and optionally, in a manner that is selective or non-selective with regard to the ARC and/or contact dielectric layer(s).

Non-limiting exemplary etching conditions for removing the BARC layer comprise exposing the portions of the BARC layer to be etched to a plasma comprising $CHF_3$ and/or $CF_4$ (preferably a mixture thereof) at a pressure of about 5–200 mTorr and a power of 100–1,000 watts in the absence of Ar. Backside cooling with He at a pressure of 2–30 Torr in the absence of a magnetic field is preferred.

Figure 6:
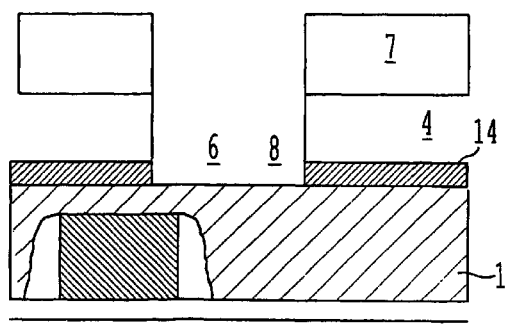
FIG. 6 illustrates a semiconductor structure comprising a trench and contact hole opening etched in the trench dielectric layer.

Suitable etching conditions for removing the exposed portions of the etch stop layer 14 comprise exposing the etch stop layer to a plasma formed from a mixture of $CF_4$ and $CHF_3$ or $CHF_3/CF_4/Ar$ or $C_4F_8$ and $O_2$, optionally in the presence of Ar, at conventional pressures and/or flow rates for such etch chemistries (e.g. at a pressure of about 70 mTorr and a power of from 500–1,500 watts, in the absence of a magnetic field). The backside of the wafer may be cooled at a He pressure of 2–30 Torr. The etched structure is illustrated in FIG. 6.

In an alternative embodiment, after the trench dielectric layer has been etched, but prior to formation of the contact opening mask 7, the exposed portion of the etch stop layer 14 may be removed, in the absence of a patterned photoresist as a contact opening mask, using the trench dielectric layer 4 as a mask. Etching of the etch stop layer is preferably conducted under conditions which do not substantially etch the material of the trench dielectric layer. After the exposed portions of the etch stop layer have been removed, a contact opening mask 7 may be formed by patterning a photoresist material and an opening in the contact dielectric layer formed by etching methods described supra.

After removing the exposed portion of the trench dielectric 4 and etch stop layer 14, the contact opening mask 7 may be removed by conventional methods known to those of ordinary skill in the art. The result is a multilayer structure in which the trench dielectric material may comprise a pattern (a so-called "hard mask") for the contact opening. This embodiment is described in greater detail in application Attorney Docket No. 7575-065-77, filed concurrently herewith. Further examples of uses and methods of making such a "hard mask" can be found in co-pending application U.S. Ser. No. 09/326,432, filed Jun. 4, 1999. Conditions should include (a) a trench dielectric thickness which is greater than the trench thickness (preferably by $\geq 100$ Å, more preferably by $\geq 200$ Å, and even more preferably by $\geq 300$ Å (typically by about 1,000 Å)) and (b) the contact dielectric material having a substantially different etch rate than the trench dielectric material when either material is etched. In this context, the contact dielectric etching step should be selective to etching the contact dielectric material relative to the gate, or more preferably, the spacer and/or cap dielectric material. An etch may be considered "selective" if the ratio of an etch rate for a first material relative to the etch rate for a second material is $\geq 5:1$, more preferably $\geq 10:1$, even more preferably $\geq 15:1$. Alternatively, the contact opening mask 7 may be left in place while etching the contact dielectric layer, a procedure which favors forming a sloped contact opening wall.

Prior to etching the contact openings, the trench layer 6 (and optionally opening 8) may be cleaned by plasma cleaning by a conventional oxygen plasma etch (which may optionally contain $CF_4$) then by a conventional sulfuric acid based wet cleaning.

Conditions for trench cleaning may include one or more of the conditions listed in Table 1 below:

TABLE 1

| Condition | General Range | Preferred Range |
|---|---|---|
| RF power (W) | 100–1,5000 | 400–600 |
| pressure (mTorr) | 10–300 | 30–80 |
| He cooling pressure (T) | 2–30 | 5–10 |
| $C_2H_2F_4$ (sccm) | 1–50 | 3–10 |
| $CHF_3$ (sccm) | 0–200 | 20–50 |
| Ar (sccm) | 0–200 | 50–150 |
| $C_4F_8$ (sccm) | 0–50 | 0–5 |
| Magnetic field (Gauss) | 0–50 | 10–30 |

Figure 7:
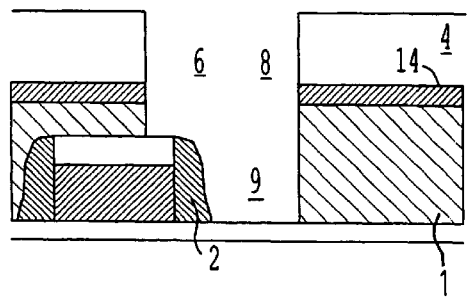
FIG. 7 illustrates a semiconductor structure comprising a trench etched in the trench dielectric layer and a contact hole etched in the contact dielectric layer.

Referring to FIG. 7, the contact dielectric layer 1 is etched to form a contact opening 9 to an underlying active region of the semiconductor substrate adjacent to gate structure 3. Greater tolerance to mask alignment errors during the patterning of opening 8 in trench dielectric layer 4 is afforded by self-aligned contact (SAC) techniques (i.e., the contact hole is "self-aligned" to spacer 2).

The etching gas may be those typically used by those of ordinary skill in the art in conventional reactive ion etching. Typically, halocarbons such as $CHF_3$, $C_4F_8$, $C_2F_6$, F-134, F-134a, $CF_4$, $SF_6$, $NF_3$ $SF_6$, $Cl_2$, HF, HCl, $CCl_4$, $C_nH_xF_y$ (where $n \geq 1$, $y \geq 1$, and $x+y=2n+2$) (see, for example, U.S. Ser. No. 08/683,407 and/or U.S. Pat. No. 5,468,342, the relevant portions of which are hereby incorporated by reference) and mixtures thereof, preferably $CHF_3$, $C_4F_8$ and/or F-134a and more preferable a mixture of $CHF_3$ and $C_4F_8$ (see U.S. Ser. No. 09/253,991 filed on Feb. 22, 1999). Carbon monoxide may also be incorporated into the etching gas as an optional component. Within the context of the present invention, the term "etching gas" refers to the components of the gas which produce active components of the plasma that etches the dielectric. Flow rates of etching gases describe herein do not include oxygen or carrier gases, unless otherwise indicated.

The total flow rate of etching gas step is typically 5 to 500 sccm, more preferably 15 to 300 sccm and even more preferably 25 to 250 sccm. Of this flow, anywhere from 4 to 450 sccm, preferably from 8 to 200 sccm may comprise a carrier gas such as Ne, Kr, Xe, CO, $CO_2$, $SO_2$, He, Ar, $N_2$ and mixtures thereof. Typically, the total flow rate of etching gas before striking the plasma is about the same or slightly more than the total flow rate of etching gas that may be used during an optional flash strike step or subsequent etch phase(s) or step(s) of the process. Suitable conditions are disclosed in U.S. Ser. Nos. 08/683,407, 08/577,751, and 08/935,705, and U.S. Pat. Nos. 5,468,342 and 5,562,801, the relevant portions of which are hereby incorporated by reference.

Figure 8:
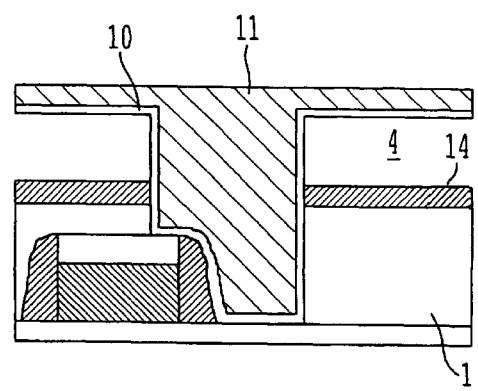
FIG. 8 illustrates a semiconductor structure comprising a liner layer and a self-aligned contact-interconnect structure.

FIG. 8 illustrates the result of depositing a bulk conductive material 11 in the contact opening and trench. Before depositing the bulk conductive material 11, an optional liner, wetting and/or barrier layer 10 may be formed. The liner, wetting and/or barrier layer may promote adherence of the conductive material to the dielectric material, as well as to the material of the conductive layer or active region therebelow (e.g., such as tungsten, $WSi_x$ or Al or doped polysilicon). The liner, wetting and/or barrier layer may also act as a barrier to prevent or inhibit diffusion between the bulk metal and the underlying substrate. Layer 10 may also comprise a single layer of material or multiple layers of the same or different materials with independently selected chemical compositions and thicknesses.

Non-limiting examples of suitable liner/wetting/barrier layer materials include titanium, zirconium, hafnium, tantalum, chromium, molybdenum, tungsten, copper, nickel, cobalt, noble metals such as ruthenium, rhodium, palladium, osmium, iridium, platinum, gold and silver, alloys thereof such as titanium-tungsten, aluminum-titanium or aluminum-silicon, and conductive nitrides thereof, such as tantalum nitride and titanium nitride. Preferably the liner/wetting/barrier, layer is titanium, a conventional titanium-tungsten alloy or titanium nitride. When the liner/wetting/barrier layer is titanium, deposition of the liner/wetting/barrier layer is preferably followed by rapid thermal annealing (RTA) in an atmosphere comprising $N_2$ or $NH_3$.

The liner/wetting/barrier layer may be deposited by conventional methods known to those of ordinary skill in the art such as chemical or plasma vapor deposition, ionized metal plasma, sputtering, etc. Deposition may also be by a collimated process. The thickness of the liner/wetting/barrier layer is typically from about 50 to about 1000 Å thick, preferably from 100 to about 600 Å thick, more preferably from 150 to about 500 Å thick. Typically, the thickness is 700 Å as measured at a flat surface outside the contact. The thickness at the sidewall is typically 0.1 x the flat surface thickness, and the thickness at the bottom to the contact is typically 0.5 x the flat surface thickness.

While the liner layer may be deposited in an amount sufficient to cover the entire exposed surface of the wafer, within the scope of the present invention, it is preferably deposited in an amount sufficient to cover the uppermost surface of the dielectric layer, the side walls and bottom of the opening. During the deposition of the liner/wetting layer, it is preferable that the deposition be conducted in a directional manner. Directional deposition may be conducted by conventional methods known to those of ordinary skill in the art, for example by collimated sputtering or by Ion Metal Plasma (IMP) methods. In one embodiment, the collimation filter may have cells with a 1:1 aspect ratio (height:diameter) or greater.

A separate barrier layer may be formed in addition to a liner/adhesive layer. When the liner layer is Ti, a separate barrier layer of TiN or TiW is preferred. Such a barrier layer may be formed by methods known to those of ordinary skill in the art without undue experimentation.

The structures are now prepared for metal deposition with a conductive material, which is not particularly limited and which may include, for example aluminum, tungsten, copper, titanium, alloys and silicides thereof, etc., preferably aluminum, copper and/or tungsten, more preferably tungsten. Non limiting examples include an Al-0.5% Cu alloy, an Al—Si-0.5% Cu alloy, Al°, Al—Ge, Al—Si—Ge, W, Cu and Cu alloys. In a preferred embodiment, the conductive material is W.

Suitable deposition conditions are those known to those of ordinary skill in the art and may comprise depositing a single bulk layer of conductive material. Deposition may be conducted using an otherwise conventional physical vapor deposition apparatus, such as a commercially available sputtering apparatus, such as an ENDURA sputtering system by Applied Materials of Santa Clara, Calif. When depositing a layer of bulk metal (e.g., Al or W), a conventional two-step (cold, then hot) or three-step (cold, hot-slow, then hot-fast) process may be used, where "cold"=$T_1$, "hot"=$T_2$, and $T_1 \leq T_2 - 40°$ C., preferably $T_1 \leq T_2 - 60°$ C. In the first stage deposition, $SiH_4$ is added to the deposition atmosphere, and nucleation of the conductive material occurs. Suitable "three-step" deposition conditions are described in co-pending application U.S. Ser. No. 08/693,978, the relevant portions of which are hereby incorporated by reference. The distance from the sputtering target material to the wafer surface is generally from about 1' to about 2".

Figure 9:
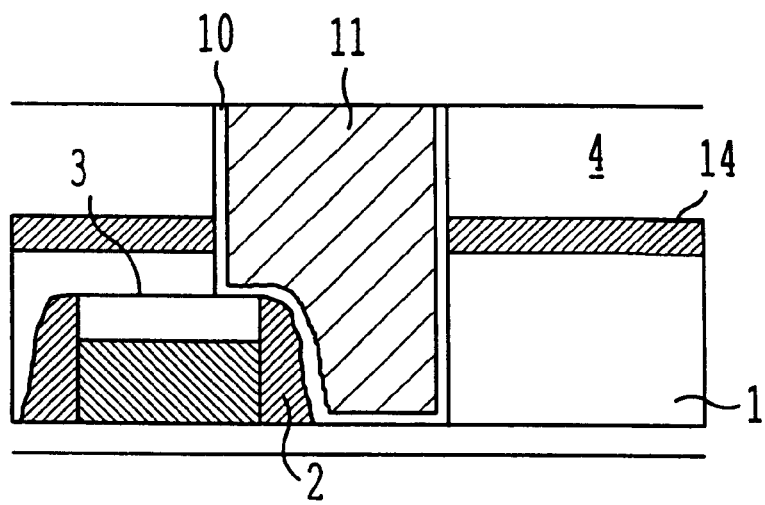
FIG. 9 illustrates a semiconductor structure comprising a self-aligned contact-interconnect structure after planarization.
Figure 10:
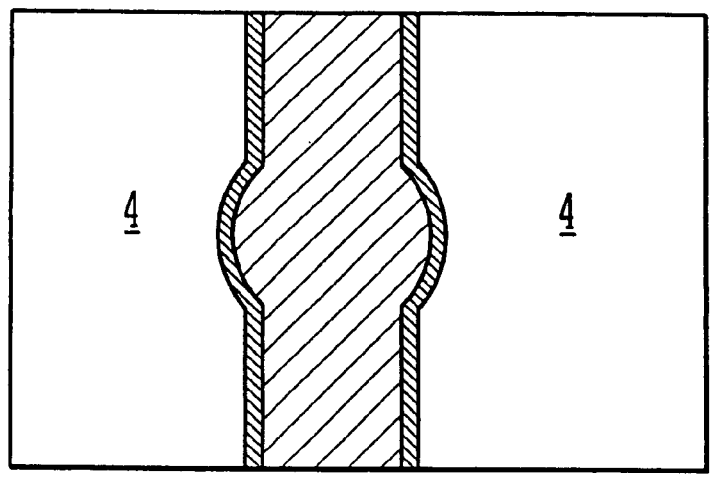
FIG. 10 illustrated a top view of the semiconductor structure illustrated in FIG. 9.

Final processing may comprise planarizing the conductive material 11 and optional liner/wetting layer 10, by methods known to those of ordinary skill in the art, such as by chemical-mechanical polishing, the result being illustrated in FIGS. 9 and 10, where FIG. 10 illustrates a top view of the structure illustrated in FIG. 9. Within the context of the present invention misalignment of the contact opening with the underlying conductive region, may occur, without preventing effective formation of SAC metallization. A more detailed explanation of misalignment of the contact opening with the underlying conductive region is found and illustrated in a U.S. Pat. Application filed concurrently, entitled "Method of Making Metallization and Contact Structures in an Integrated Circuit" U.S. Ser. No. 09/593,967 The conductive material is preferably planarized until its uppermost surface is substantially coplanar with an uppermost surface of the trench dielectric layer. Thereafter, the method may further comprise depositing an interlayer dielectric layer over the (coplanar) conductive material and trench dielectric layer by methods known to those skilled in the art. An interlayer dielectric comprising silicon nitride may be used as an interface between layers of a stacked structure (multilayered structure) comprising borderless contacts. Although the preferred interlayer dielectric layer comprises a TEOS layer, any suitable dielectric material from those described above for the trench dielectric layer may be selected. A low k dielectric may be used, as well as silicon nitride (or etch stop material) for border less contacts. In addition a plurality of layers (e.g. BARC, low k, protective) may be used in a multilayer structure. The interlayer dielectric layer, which may be from 1000 to 5000 Å thick, may then be planarized by methods known to those skilled in the art prior to further processing, for example by reflowing or chemical mechanical polishing.

The present invention also relates to an integrated circuit containing the above-escribed structure(s).

This application describes a method of forming metallization and contact structures in an integrated circuit using a "dual damascene" metallization procedure. A similar process for forming metallization and contact structures in an integrated circuit without an etch stop layer is described in a U.S. patent application filed concurrently, entitled "Method of Making Metallization and Contact Structures in an Integrated Circuit" U.S. Ser. No. 09/593,967, the entire contents of which are hereby incorporated by reference.

The present application describes an etching procedure for making contact openings and trench structures through multiple layers of dielectric materials. The present application describes an etching procedure for making contact openings and trench structures through multiple layers of dielectric materials. It is within the scope of the present invention, to use an analogous method to simultaneously form metallization and contacts or vias to an underlying metallization structure.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for forming a metallization and contact structure in an integrated circuit, comprising:
   a) etching a trench dielectric layer of a composite structure comprising:
      i) a semiconductor substrate comprising an active region,
      ii) a gate structure thereon,
      iii) at least one dielectric spacer adjacent to said gate structure;
      iv) a contact dielectric layer over said semiconductor substrate, said gate structure and said dielectric spacer;
      v) an etch stop layer over said contact dielectric layer; and
      vi) a trench dielectric layer over said etch stop layer; to form a trench in said trench dielectric under etch conditions which do not substantially etch said etch stop layer;
   b) forming an opening in said etch stop layer and said contact dielectric layer by etching under conditions which do not substantially damage said gate structure, to expose said active region and a portion of said dielectric spacer; and
   c) depositing a conductive material into said opening and said trench.

2. The method of claim 1, wherein said composite structure comprises a contact opening mask while forming said opening.

3. The method of claim 1, wherein forming said opening comprises etching said etch stop layer and said contact dielectric layer.

4. The method of claim 3, wherein etching said trench dielectric layer etches substantially through an entire thickness of said trench dielectric layer.

5. The method of claim 1, wherein said trench dielectric layer has a thickness of from 500 to 4000 Å.

6. The method of claim 1, wherein said etch stop layer has a thickness of from 100 to 1500 Å.

7. The method of claim 1, wherein said contact dielectric layer has a thickness of from 1500 to 4000 Å.

8. The method of claim 1, wherein etching said trench dielectric layer is conducted under conditions providing an etch rate of at least 5:1 relative to that of said etch stop layer.

9. The method of claim 1, wherein etching said contact dielectric layer is conducted under conditions providing an etch rate of at least 5:1 relative to that of said spacer and said ate structure.

10. The method of claim 1, further comprising forming a layer selected from the group consisting of a liner, a wetting layer, a barrier layer, or a combination thereof in said opening and said trench before depositing said conductive material into said opening and said trench.

11. The method of claim 10, wherein said liner layer, said wetting layer, said barrier layer, or said combination thereof has a thickness of from 50 Å to 1000 Å.

12. The method of claim 1, further comprising planarizing said conductive material until its uppermost surface is substantially coplanar with an uppermost surface of said trench dielectric layer.

13. The method of claim 12, further comprising depositing an interlayer dielectric layer over said planarized conductive material and said trench dielectric layer.

14. The method of claim 1, wherein said composite structure further comprises an anti-reflective coating disposed between said trench dielectric layer and said patterned photoresist.

15. The method of claim 14, wherein said anti-reflective coating comprises an organic anti-reflective coating.

16. The method of claim 14, wherein said anti-reflective coating comprises a dielectric anti-reflective coating.

17. The method of claim 1, wherein said trench dielectric layer comprises a TEOS layer.

18. The method of claim 1, wherein said contact dielectric layer comprises a doped silicate glass.

19. The method of claim 18, wherein said doped silicon oxide contact dielectric layer comprises a member selected from the group consisting of a phosphosilicate glass, a borophosphosilicate glass and a fluorosilicate glass.

20. The method of claim 1, wherein said etch stop layer comprises silicon nitride.

* * * * *

UNITED STATES PATENT AND TRADEMARK OFFICE
CERTIFICATE OF CORRECTION

PATENT NO.     : 6,399,512 B1
DATED          : June 4, 2002
INVENTOR(S)    : Blosse et al.

It is certified that error appears in the above-identified patent and that said Letters Patent is hereby corrected as shown below:

<u>Title page,</u>
Item [75], should read:

-- [75] Inventors: Alan Blosse, Belmont; Sanjay Thekdi, Santa Clara; Jianmin Qiao, Fremont; Yitzhak Gilboa, Sunnyvale, all of CA (US) --

Signed and Sealed this

Twenty-eighth Day of January, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,399,512 B1
APPLICATION NO. : 09/593968
DATED : June 4, 2002
INVENTOR(S) : Blosse et al.

Page 1 of 1

It is certified that error appears in the above-identified patent and that said Letters Patent is hereby corrected as shown below:

<u>Title page,</u>
Item [75], should read:

-- [75] Inventors: Alain Blosse, Belmont; Sanjay Thekdi, Santa Clara; Jianmin Qiao, Fremont; Yitzhak Gilboa, Sunnyvale, all of CA (US) --

This certificate supersedes Certificate of Correction issued January 28, 2003.

Signed and Sealed this

Tenth Day of October, 2006

JON W. DUDAS
*Director of the United States Patent and Trademark Office*